United States Patent
Calmon et al.

(10) Patent No.: US 11,461,145 B2
(45) Date of Patent: Oct. 4, 2022

(54) BUILDING NEURAL NETWORKS FOR RESOURCE ALLOCATION FOR ITERATIVE WORKLOADS USING REINFORCEMENT LEARNING

(71) Applicant: EMC IP Holding Company LLC, Hopkinton, MA (US)

(72) Inventors: Tiago Salviano Calmon, Rio de Janeiro (BR); Vinícius Michel Gottin, Rio de Janeiro (BR)

(73) Assignee: EMC IP Holding Company LLC, Hopkinton, MA (US)

(*) Notice: Subject to any disclaimer, the term of this patent is extended or adjusted under 35 U.S.C. 154(b) by 700 days.

(21) Appl. No.: 16/259,244

(22) Filed: Jan. 28, 2019

(65) Prior Publication Data
US 2020/0241921 A1 Jul. 30, 2020

(51) Int. Cl.
  *G06F 9/50* (2006.01)
  *G06N 3/04* (2006.01)
  *G06F 30/20* (2020.01)

(52) U.S. Cl.
  CPC .............. *G06F 9/505* (2013.01); *G06F 30/20* (2020.01); *G06N 3/0472* (2013.01)

(58) Field of Classification Search
  CPC .............................. G06N 3/0472; G06F 9/505
  See application file for complete search history.

(56) References Cited

U.S. PATENT DOCUMENTS

| | | | |
|---|---|---|---|
| 2004/0015386 A1* | 1/2004 | Abe | G06Q 30/0239 705/7.29 |
| 2013/0097321 A1* | 4/2013 | Tumbde | G06F 11/3433 709/226 |
| 2018/0018814 A1* | 1/2018 | Dahm | G06N 7/005 |

OTHER PUBLICATIONS

Tesauro et al. (A Hybrid Reinforcement Learning Approach to Autonomic Resource Allocation, Jun. 2006, pp. 65-73) (Year: 2006).*
Mao et al. (Resource Management with Deep Reinforcement Learning, Nov. 2016, pp. 50-56) (Year: 2016).*
Natarajan et al. (Dynamic Preferences in Multi-Criteria Reinforcement Learning, pub. 2005, pp. 601-608) (Year: 2005).*

(Continued)

*Primary Examiner* — George Giroux
(74) *Attorney, Agent, or Firm* — Ryan, Mason & Lewis, LLP

(57) ABSTRACT

Reinforcement learning agents for resource allocation for iterative workloads, such as training Deep Neural Networks, are configured. One method comprises obtaining a specification of an iterative workload comprising multiple states and a set of available actions for each state, and a domain model of the iterative workload relating allocated resources with service metrics; adjusting weights of a reinforcement learning agent by performing iteration steps for each simulated iteration of the iterative workload and using variables from the simulated iteration to refine the reinforcement learning agent; and determining a dynamic resource allocation policy for the iterative workload. The exemplary iteration steps comprise: (a) selecting an action for a current state, obtaining a reward for the selected action and selecting a next state based on the current state and/or the selected action; (b) updating a function that evaluates a quality of a plurality of state-action combinations; and (c) repeating steps (a) and (b) with a new allocation of resources.

20 Claims, 13 Drawing Sheets

(56) References Cited

OTHER PUBLICATIONS

U.S. Appl. No. 15/961,035 entitled, "Deep Reinforcement Learning for Workflow Optimization using Provenance-Based Simulation", filed on Apr. 24, 2018.
U.S. Appl. No. 15/800,587 entitled, "Simulation-Based Online Optimization of Workflows", filed on Nov. 1, 2017.
Kaelbling et al., "Reinforcement Learning: a survey," Journal of Artificial Intelligence Research, vol. 4, pp. 237-285, 1996.
Abadi et al., "TensorFlow: A system for large-scale machine learning," in 12th USENIX Symposium on Operating Systems Design and Implementation (OSDI 16), 2016.

* cited by examiner ns for resource allocation for iterative workloads.

BUILDING NEURAL NETWORKS FOR RESOURCE ALLOCATION FOR ITERATIVE WORKLOADS USING REINFORCEMENT LEARNING

FIELD

The field relates generally to resource allocation techniques for workloads.

BACKGROUND

Using an infrastructure efficiently to execute workloads while respecting Service Level Agreements (SLAs) and, thus, guaranteeing a specified Quality of Service, poses a number of challenges. One challenge is that SLAs are typically set prior to execution of a job, but the execution environment is subject to a number of possible disturbances (e.g., poor knowledge about actual resource needs, demand peaks and/or hardware malfunctions). Thus, employing a fixed amount of allocated resources may not be a good solution.

A need therefore exists for improved techniques for resource allocation for workload execution.

SUMMARY

In one embodiment, a method comprises obtaining (i) a specification of an iterative workload comprising a plurality of states of the iterative workload and a set of available actions for one or more of the plurality of states, and (ii) a domain model of the iterative workload that relates an amount of resources allocated in training data with one or more service metrics, wherein a duration of one simulated iteration using said domain model of the iterative workload satisfies one or more predefined duration criteria; adjusting weights of at least one reinforcement learning agent by performing iteration steps for each simulated iteration of the iterative workload and then using variables observed during the simulated iteration to refine the at least one reinforcement learning agent; and determining, by the at least one reinforcement learning agent, a dynamic resource allocation policy for the iterative workload, wherein the iteration steps for each simulated iteration of the iterative workload comprise: (a) employing the at least one reinforcement learning agent to select an action from the set of available actions for a current state, obtain a reward for the selected action and select a next state based on one or more of the current state and the selected action for the current state; (b) updating, by the at least one reinforcement learning agent, a function that evaluates a quality of a plurality of state-action combinations; and (c) repeating the employing and updating steps with a new allocation of resources for simulated iteration of the iterative workload.

In some embodiments, the domain model is obtained from sample training executions used to learn the relationship between the amount of resources allocated and the one or more service metrics. The simulated iteration executes in a simulated environment that optionally generates observations from the domain model. The iterative workload comprises, for example, a training of a Deep Neural Network.

Other illustrative embodiments include, without limitation, apparatus, systems, methods and computer program products comprising processor-readable storage media.

DETAILED DESCRIPTION

Figure 1:
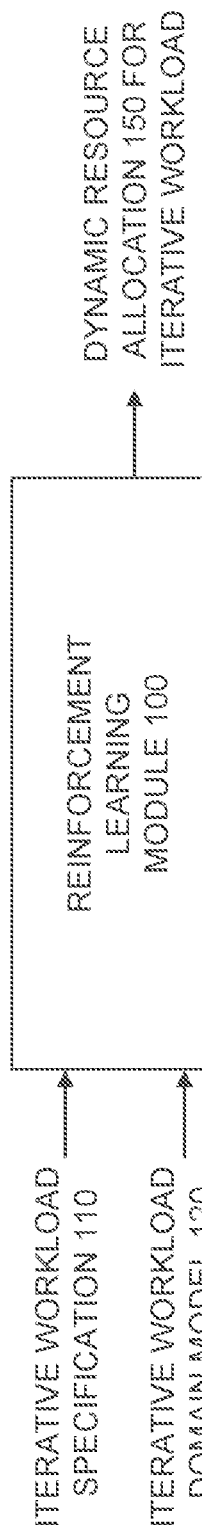
FIG. 1 illustrates an exemplary reinforcement learning module for allocating resources for an iterative workload, according to an embodiment of the disclosure.

Illustrative embodiments of the present disclosure will be described herein with reference to exemplary communication, storage and processing devices. It is to be appreciated, however, that the disclosure is not restricted to use with the particular illustrative configurations shown. One or more embodiments of the disclosure provide methods, apparatus and computer program products for configuring reinforcement learning agents for resource allocation for iterative workloads.

In one or more embodiments, the present disclosure provides techniques for adapting a resource allocation for a particular job based on control theory. As a subset of the adaptive control space, Reinforcement Learning, such as Deep Q-Learning Networks, are suited to address such resource allocation challenges and, thus, some embodiments provide a mechanism to adapt the amount of resources based on this reinforcement learning technique.

The general resource allocation problem has garnered increased attention due to a number of developments in pay-per-use computation models. These models arise from, for example, Cloud Computing, Platform-as-a-Service (PaaS) and Function-as-a-Service (FaaS) paradigms. In these paradigms, resource abstractions, such as containers, relieve the customer from explicitly defining infrastructure requirements. It is also possible to offer computation without the customer having to know which underlying infrastructure is running the appropriate software code.

In each of these paradigms, the usual agreements upon Quality of Service expected by the customer are expressed through one or more service metrics, such as SLAs. The SLAs typically include specifications for, for example, response time, execution time and uptime percentage. The levels of SLAs are usually agreed upon prior to the service through reference values called SLA metrics, and must be respected. A failure to satisfy these agreements may cause the service providers to incur a fine, and may also diminish the trust that a customer holds for the service providers. Service providers aim to provide services to their customers respecting SLAs, while also minimizing resource usage. To do so, a static approach of resource allocation, which dedicates resources to a given job from a start of the given job through job completion, is naturally inefficient, and, thus, sub-optimal.

In one or more embodiments, techniques are provided for resource allocation for Deep Neural Network (DNN) training tasks and other iterative tasks. In some embodiments, the disclosed approach is based on Deep Q-Learning techniques and leverages previous experience and work in the general resource allocation problem via adaptive control techniques. In at least one embodiment, training is performed in a simulated iterative workload to control an actual workload.

Consider, for example, the resource allocation problem for DNN training tasks in shared environments. These tasks raise complications due to the long time required for each iteration. In at least one embodiment, deep reinforcement learning agents are trained in a reasonable training time by leveraging domain knowledge for training sample generation.

U.S. patent application Ser. No. 15/800,587, filed Nov. 1, 2017, entitled "Simulation-Based Online Optimization of Workflows," (now U.S. Pat. No. 11,004,025), incorporated by reference herein in its entirety, describes the general resource allocation problem. One or more embodiments of the present disclosure address the challenge of dynamic resource allocation for DNN training tasks.

Reinforcement learning approaches are appropriate for the resource allocation problem, given its dynamic nature. Reinforcement learning techniques are able to cope with the exploration versus exploitation tradeoff and are typically adopted when agents need to decide between exploring new opportunities and sticking to a previously learned solution. On the other hand, such approaches typically require a large number of samples for convergence.

The task of deep neural network training configures a particular case of long-time workloads in which a single iteration takes a long time to compute. In some embodiments, a long-time workload, such as training one or more deep neural networks, is considered a long-time workload when it is infeasible to perform the workload repeatedly in a reasonable time. The process of training a reinforcement learning agent, for example, in this context, comprises at least 10,000 executions of the same iteration (e.g., a DNN epoch) and, if this iteration takes a significant amount of time (say, a second or more) to be executed, this would make the training of the RL agent infeasible. As an exemplary rule of thumb, without limitation, any iteration that takes more than 10 times to be executed than its simulated counterpart, could be classified as a long-time workload.

In DNN training, an epoch may take several minutes. This is a much longer time than what is typically available for decision making. The long iteration time in the task also effectively prohibits the application of learning approaches, such as reinforcement learning.

Reinforcement Learning, and especially Deep Q-Learning, typically require a significant number of subsequent samples in its training. Thus, it is not feasible to rely on actual executions of the workloads for the training of such networks. In one typical scenario, a Deep Q-Learning agent requires millions of samples for convergence; and each sample (e.g., each DNN epoch) takes hundreds of seconds to compute. An alternative form of learning is needed.

FIG. 1 illustrates an exemplary reinforcement learning module 100 for allocating resources for an iterative workload, according to an embodiment of the disclosure. As shown in FIG. 1, the exemplary reinforcement learning module 100 processes an iterative workload specification 110, comprising a plurality of states of the workload and a set of available actions for one or more of the plurality of states, and an iterative workload domain model 120 that relates an amount of resources allocated in training data with one or more service metrics, such as Service Level Agreement metrics. The iterative workload specification 110 and the iterative workload domain model 120 are discussed further below.

The exemplary reinforcement learning module 100 generates a dynamic resource allocation 150 for the iterative workload using the disclosed techniques for configuring reinforcement learning agents for resource allocation for iterative workloads.

Figure 2:
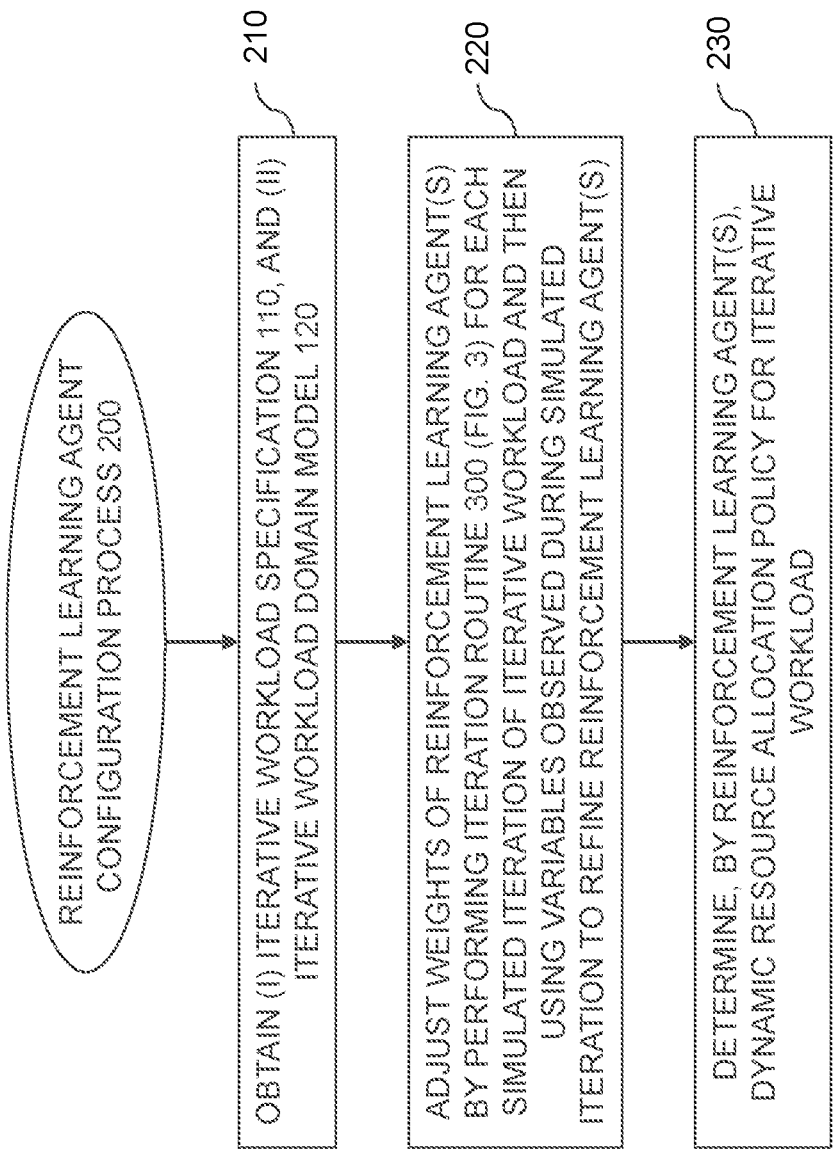
FIG. 2 is a flow chart illustrating an exemplary implementation of a reinforcement learning agent configuration process for resource allocation for iterative workloads, according to one embodiment of the disclosure.

FIG. 2 is a flow chart illustrating an exemplary implementation of a reinforcement learning agent configuration process 200 for resource allocation for iterative workloads, according to one embodiment of the disclosure. As shown in FIG. 2, the exemplary reinforcement learning agent configuration process 200 initially obtains (i) the iterative workload specification 110 of FIG. 1, and (ii) the iterative workload domain model 120 during step 210. It is noted that a duration of one simulated iteration using the iterative workload domain model 120 of the iterative workload satisfies one or more predefined duration criteria, discussed below.

During step 220, the exemplary reinforcement learning agent configuration process 200 adjusts weights of one or more reinforcement learning agents by (i) performing a number of iteration steps of an iteration routine 300, as discussed further below in conjunction with FIG. 3, for each simulated iteration of the iterative workload and then (ii) using variables observed during the simulated iteration to refine the one or more reinforcement learning agents.

Finally, during step 230, the reinforcement learning agent configuration process 200 determines, using the at least one reinforcement learning agent, a dynamic resource allocation policy for the iterative workload.

Figure 3:
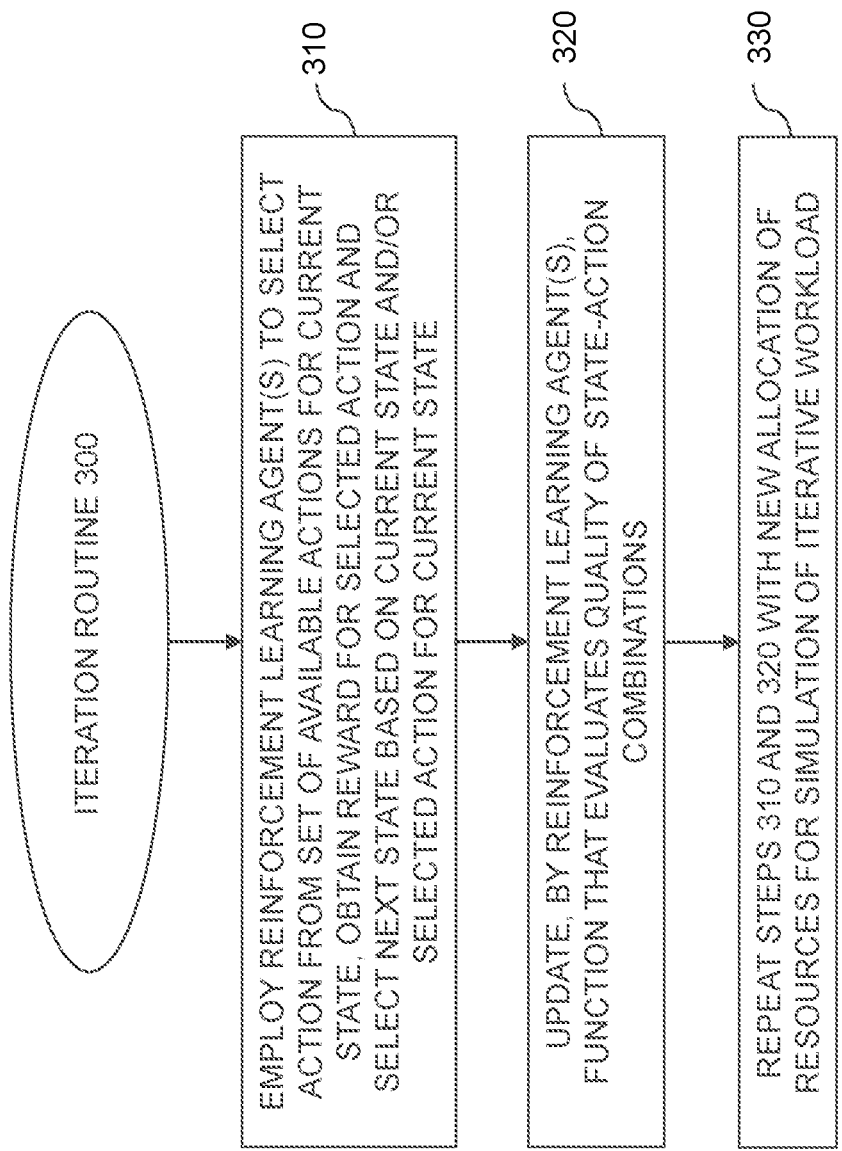
FIG. 3 is a flow chart illustrating an exemplary implementation of an iteration routine implemented by the reinforcement learning agent configuration process of FIG. 2, according to some embodiments of the disclosure.

FIG. 3 is a flow chart illustrating an exemplary implementation of an iteration routine 300 implemented by the reinforcement learning agent configuration process 200 of FIG. 2 during step 220, according to some embodiments of the disclosure. As shown in FIG. 3, the exemplary iteration routine 300 employs one or more reinforcement learning agents during step 310 to select an action from the set of available actions for the current state, obtain a reward for the selected action and to select a next state based on the current state and/or the selected action for the current state.

The iteration routine 300 then updates, using the one or more reinforcement learning agents, a function that evaluates a quality of the state-action combinations during step 320. Finally, steps 310 and 320 are repeated during step 330 with a new allocation of resources for the simulation of the iterative workload.

Resource Allocation

The problem of resource allocation can be framed as follows. Given a workload and a set of SLAs or one or more service metrics, determine a substantially minimum amount of resources that need to be dedicated to that particular workload in order to comply with all SLAs.

Figure 4:
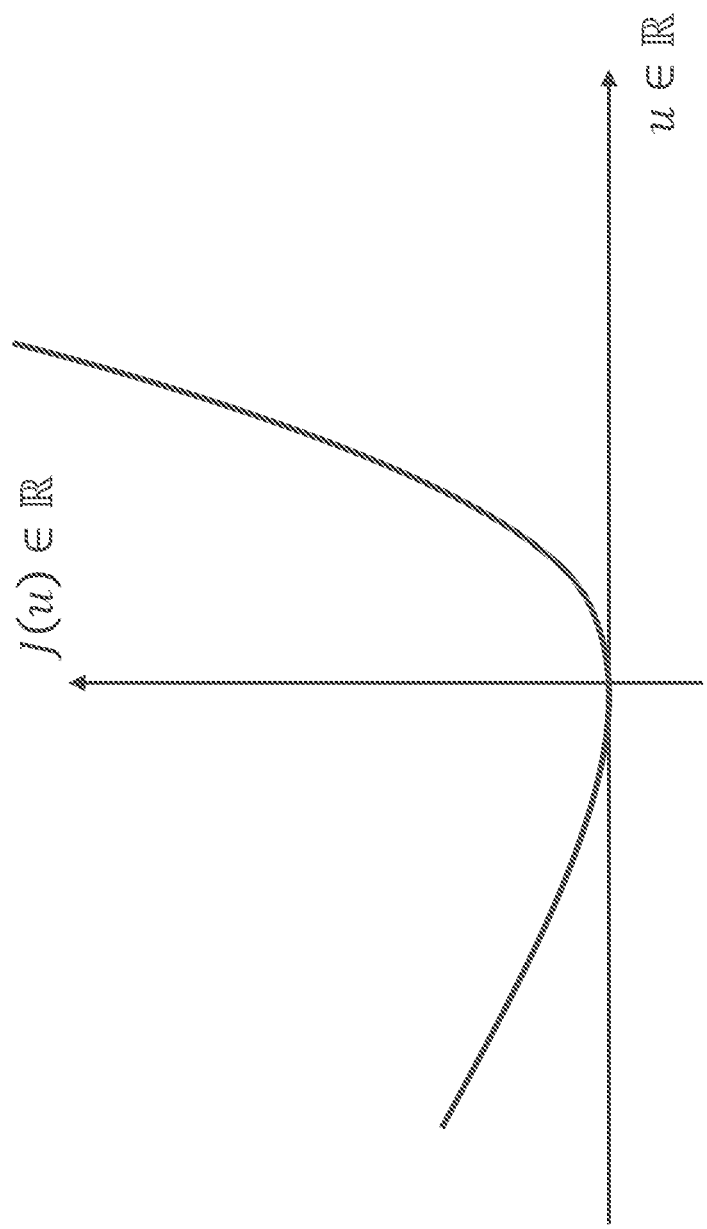
FIG. 4 illustrates an exemplary alpha function as a function of an amount of allocated resources, according to at least one embodiment.

This problem can be understood as a nonstationary optimization problem that aims to substantially minimize a function, J. Formally, the function, J, can be defined as a function of the error, as follows:

$$J(u) = \alpha(m_{obs}(u,k) - m_{SLA}), \quad (1)$$

where u is an amount of resources allocated, k is a milestone, $m_{SLA}$ is the reference levels of the particular metric, $m_{obs}$ is a function of u and k, and $\alpha$ is an asymmetric function as shown in FIG. 4. FIG. 4 illustrates an exemplary alpha function, J, as a function of the amount of allocated resources, where positive errors are more heavily penalized than negative errors, according to at least one embodiment.

The optimization problem can optionally be formalized, as follows:

$$\min_u J(u). \quad (2)$$

One particular problem is that access to $m_{obs}$ is not possible prior to an execution, and following execution, $m_{obs}$ is useless, since the execution already occurred. One solution is to use an unbiased estimator $\hat{m}_{obs}$ that respects the following relation:

$$\mathbb{E}[\hat{m}_{obs}] = m_{obs}. \quad (3)$$

In addition, the objective function is changed accordingly, using the estimator $\hat{m}_{obs}$ instead of the real $m_{obs}$. In one or more embodiments, a methodology is provided to build such an estimator using an artificial neural network that estimates this estimator function and suggests corrections in the allocations.

Reinforcement Learning

Reinforcement Learning is a technique within the machine learning field in which virtual agents take actions so as to maximize a cumulative reward. For a detailed discussion of Reinforcement Learning, see, for example, L. P. Kaelbling, M. L. Littman and A. W. Moore, "Reinforcement Learning: a Survey," *Journal of Artificial Intelligence Research*, Vol. 4, 237-85 (1996), incorporated by reference herein in its entirety.

Reinforcement Learning differs from other supervised learning techniques in that it does not rely on labeled complete input-output samples (e.g., there is no strict need for providing complete examples where the output for each input is known a priori). Instead, Reinforcement Learning seeks to optimize the process at each decision step by balancing an exploration of states (possibly still unknown) and exploration of the current best-guess. The output of a Reinforcement Learning solution is a policy determining the estimated optimal action at each possible state within the environment.

A Reinforcement Learning application defines the following aspects: the environment, the agent, the actions available to the agent, and the reward for each action. Several possible techniques exist, such as SARSA (State Action Reward State Action) or Q-Learning (based on an action-value function).

In one or more embodiments of the present disclosure, the Q-Learning technique is employed. In particular, an application of the Deep Q-Learning technique is employed, as discussed further below.

In at least one embodiment, the system model comprises an agent, a set of states S and a set of actions per state A. By performing an action a∈A, the agent can move between states. Executing an action in a specific state provides the agent with a reward (e.g., a numerical score). The goal of the agent is typically to substantially maximize its total reward. The agent does this by learning which action is substantially optimal for each state. The action that is optimal for each state is the action that has the highest long-term reward. This reward is a discounted sum of the expected values of the rewards of all future steps starting from the current state. The discount factor γ is a number between 0 and 1 and trades off the importance of sooner versus later rewards. γ may also be interpreted as the likelihood to succeed (or survive) at every step.

The exemplary algorithm therefore estimates a function that determines the quality of a state-action combination:

$$Q: S \times A \mapsto \mathbb{R}. \quad (4)$$

Before learning has started, the Q function returns an (arbitrary) fixed value, chosen by the designer. Then, at each possible time t, the agent selects an action $a_t$, observes a reward $r_t$ and selects a new state $s_{t+1}$ that may depend on both the previous state $s_t$ and the selected action. The core of the algorithm is a value iteration update, using the weighted average of the old value and the new information. The Q-function is updated as follows:

$$Q(s_t, a_t) \leftarrow (1-\alpha)\underbrace{Q(s_t, a_t)}_{\text{Old value}} + \underbrace{\alpha}_{\text{Learning rate}} \underbrace{\left( \underbrace{r_t}_{\text{Reward}} + \underbrace{\gamma}_{\text{Discount factor}} \underbrace{\max_a Q(s_{t+1}, a)}_{\text{Estimate of optimal future value}} \right)}_{\text{Learned Value}},$$

where $r_t$ is the instantaneous reward observed for the current state $s_t$ and $\alpha$ is the learning rate (0<α≤1).

An episode or epoch of the algorithm ends when state $s_{t+1}$ is a final state (or, "absorbing state"). However, Q-learning can also learn in non-episodic tasks. If the discount factor is lower than one, then the action values are finite even if the problem comprises infinite loops. Thus, after running a certain number of epochs, the Q function converges and taking the maximum value $$\left(\text{e.g., } \max_a Q(s_t, a)\right)$$

yields the substantially optimum policy for each state.

In the Deep Q-Learning approach, a deep Q neural network (QDNN) represents the value function which maps states into their corresponding expected values. The use of neural networks as a function approximator to represent the value function addresses the challenge of dealing with a state space with large cardinality, or an infinite state space, by leveraging correlations between state features and corresponding state values.

For a further discussion of Deep Q-Learning approaches and QDNNs, see, for example, U.S. patent application Ser. No. 15/961,035, filed Apr. 24, 2018, entitled "Deep Reinforcement Learning for Workflow Optimization using Provenance-Based Simulation," incorporated by reference herein in its entirety.

Online Resource Allocation with Deep-Q Learning

In some embodiments, a series of steps are performed for online adaptation in infrastructure for allocating resources for long-time iterative workloads. This particular kind of workload is defined as a set of source codes that perform a job. It is noted that the entry parameters of a workload might change, as well as the service levels, but that does not change the workload itself.

The exemplary long-time iterative workload is the training of a deep neural network performed in fixed sized epochs. However, the resource allocation techniques described herein can be generalized to any repetitive long-time workload, as would be apparent to a person of ordinary skill in the art. Furthermore, since a workload can be defined as the repetition of a workload, the disclosed resource allocation techniques can be employed in environments that execute the same job multiple times.

The exemplary methodology works in two steps: a domain modeling step and the Deep Q-Learning training step, discussed further below.

A. Domain Modeling

A domain model can be generated with a reasonable confidence level so as to support the generation of samples for the training step, described in the following section.

The first step is to gather training data. Specifically, the goal is to gather data at each milestone of the workload in the format d=(r, s), where r corresponds to the resource of interest allocated from the previous milestone until that particular milestone; and s is a set of SLA metrics.

Generally, code can be instrumented at assembly level to give hints of what is executing and milestones. See, for example, M. Abadi et al., "TensorFlow: A System for Large-Scale Machine Learning," 12*th USENIX Symposium on Operating Systems Design and Implementation* (*OSDI 16*) (2016), incorporated by reference herein in its entirety.

In the particular case of Deep Learning Workloads, there are several libraries that incorporate reports over each milestone. See, for example, F. Chollet et al, *Keras*, (2015), incorporated by reference herein in its entirety.

With a sufficient number of sequential tuples $(d_1, d_2, \ldots, d_N)$, $I=\{1,2,\ldots,N\}$ being the set of milestones of the workload, one can generate a set of models that relates the amount of resources r with each of the elements of set s. The number of observations can be arbitrarily chosen, but good practices in machine learning suggest a number of samples at least 10 times greater than the number of parameters that will be learned.

Figure 5:
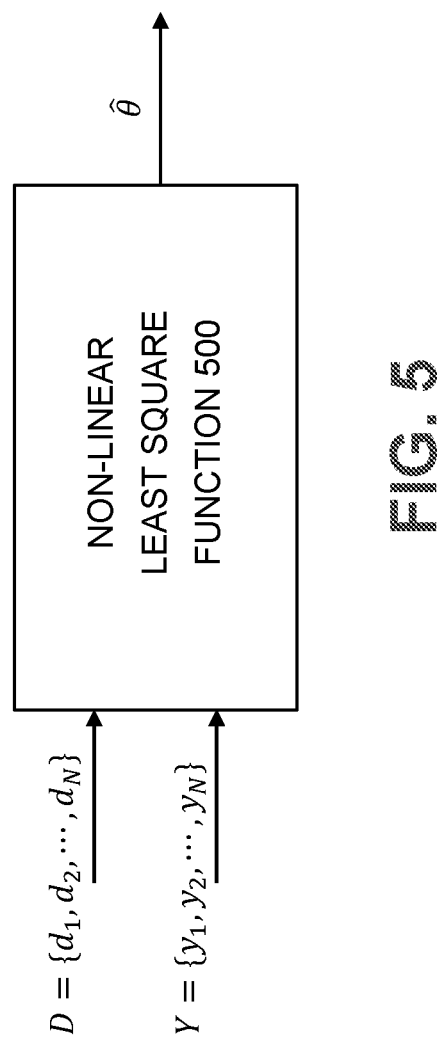
FIG. 5 illustrates an exemplary pipeline of learning parameters using non-linear least square functions, according to one or more embodiments.

FIG. 5 illustrates an exemplary pipeline of learning parameters using non-linear least square functions 500, according to at least one embodiment. For the exemplary workload (e.g., a deep neural network training session), an exponentially decaying curve is empirically defined as a fitting model for the relation between resources allocated and an SLA metric, such as a time to finish. As discussed further below in conjunction with FIG. 11, it is shown that this relation holds for training a DNN to detect handwritten digits. Moreover, Amdahl's Law states that a program has parallelizable portions and non-parallelizable portions, which enforces the exponential relation between an amount of resources allocated and SLA metrics, such as a time to finish. The exponentially decaying curve is represented by equation (6), as an exponential decaying curve plus a plateau, as follows:

$$y=\theta_1 \cdot e^{-\theta_2 x}+\theta_3. \tag{6}$$

As shown in FIG. 5, the set, D, of pairs of allocations and set-point targets used until milestones of the workload (to be used as training data for the models relating the amount of resources r with the elements of set s), as well as the representation, Y, of an exponentially decaying curve (as the exemplary selected fitting model that relates resources allocated and time to finish), are applied to a non-linear least squares function 500, to learn a set of parameters, θ, for the exemplary exponentially decaying curve.

Using a rule of thumb, in order to learn the three parameters $\theta_1$, $\theta_2$ and $\theta_3$, the minimum amount of observations needed, in at least some embodiments, would be 30, or 10 times greater than the number of parameters, in the general case. As previously stated, the present disclosure focuses on DNN training workloads, but the concepts are generalizable to other long-time repetitive workloads. The generalization of this example and exemplary values to other applicable domains, modeled by other kinds of given parametric equations, should be apparent to a person of ordinary skill in the art.

The domain modeling stage thus requires a certain number of sample executions, as stated above. These can be used to parameterize the domain model. After gathering data, the system learns the underlying dynamics between the resources allocated and the service level metrics.

This can be performed in a number of ways including linear regression, non-linear regression, support vector regression, among others. It has been found that a nonlinear model is fitting in the domain of training of deep neural networks. Again, for clarification, considering the example of the relation between resources and time to finish, Amdahl's Law states that there is always a parallelizable portion of workloads and a portion that cannot be parallelizable. Usage of the exponential decaying plus plateau function, as represented by equation (6), is, then, a natural way to learn such parameters in the present exemplary context.

B. Deep Q-Learning Training

As previously indicated, in one or more embodiments, a reinforcement learning agent is trained using Deep Q-Learning techniques. The resulting agent determines a dynamic resource allocation policy for the training of deep neural networks.

As noted above, some exemplary embodiments address the problem of resource allocation for the task of training deep neural networks. The disclosed resource allocation techniques, however, can be generalized to other kinds of long-time iterative workloads. In the DNN training task, an epoch refers to one iteration over the entire training set. That is, a DNN training task epoch refers to one pass of the network over the available training samples.

The available time for the complete training task (likely given by the SLA in place) is divided by the required number of training task epochs to yield the set point (e.g., the target time expected of each training task epoch).

In the training of a deep reinforcement learning agent for resource optimization in DNN training tasks, the absolute difference between the set point and the observed elapsed time for each training task epoch comprises the reward. That is, a negative reward that the agent seeks to minimize is assumed.

Figure 6:
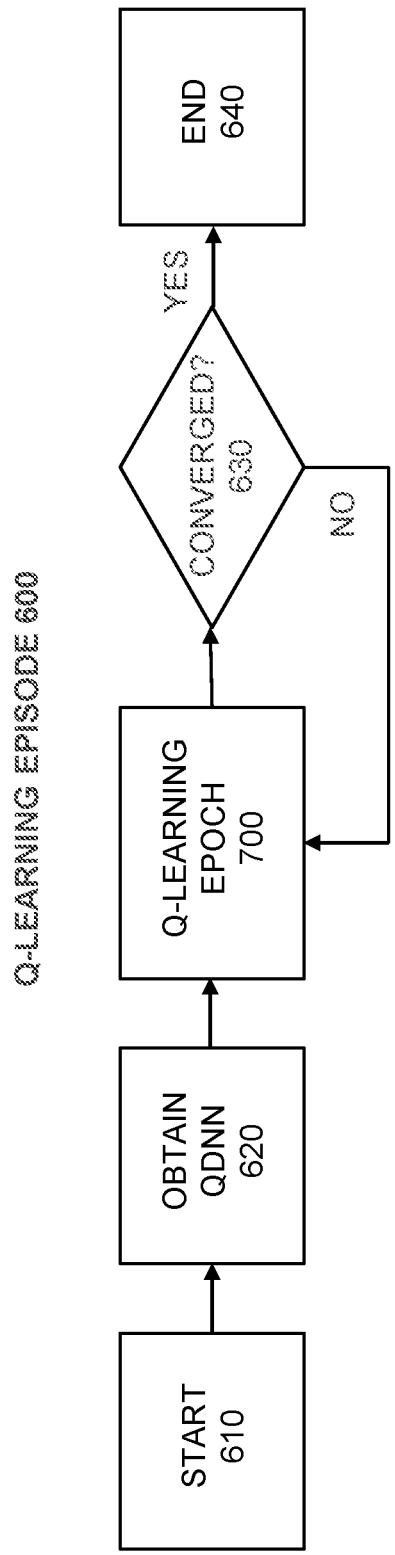
FIG. 6 illustrates an episode of a typical Deep Q-Learning process, according to some embodiments.

As noted above, the training of a Deep Q-Learning agent comprises many episodes. FIG. 6 illustrates an episode 600 of a typical Deep Q-Learning process, according to some embodiments. Generally, the exemplary Deep Q-Learning process is started at step 610 and a QDNN is obtained at stage 620 (e.g., by initializing a new QDNN (with random weights, in the typical approach) or by loading the QDNN resulting from a previous episode).

Thereafter, a Q-Learning epoch stage 700 is implemented, as discussed further below in conjunction with FIGS. 7 and 8. Generally, the exemplary Q-Learning epoch stage 700 comprises several sub-stages and is repeated until convergence is detected at stage 630, or until the final state of the system is reached, as discussed above. For example, the convergence criteria may consider whether each iteration obtains better estimates than a prior iteration. The exemplary Deep Q-Learning process ends at step 640.

As noted above, in the Deep Q-Learning approach, a QDNN is used as a function approximator to the Q function, $Q:(s, a) \rightarrow Q(s, a)$ where s and a are a state and an action, respectively. Thus, the updating of the Q function itself corresponds to the training of a deep neural network (in stage "QDNN training 620," not to be confused with the DNN training task).

Figure 7:
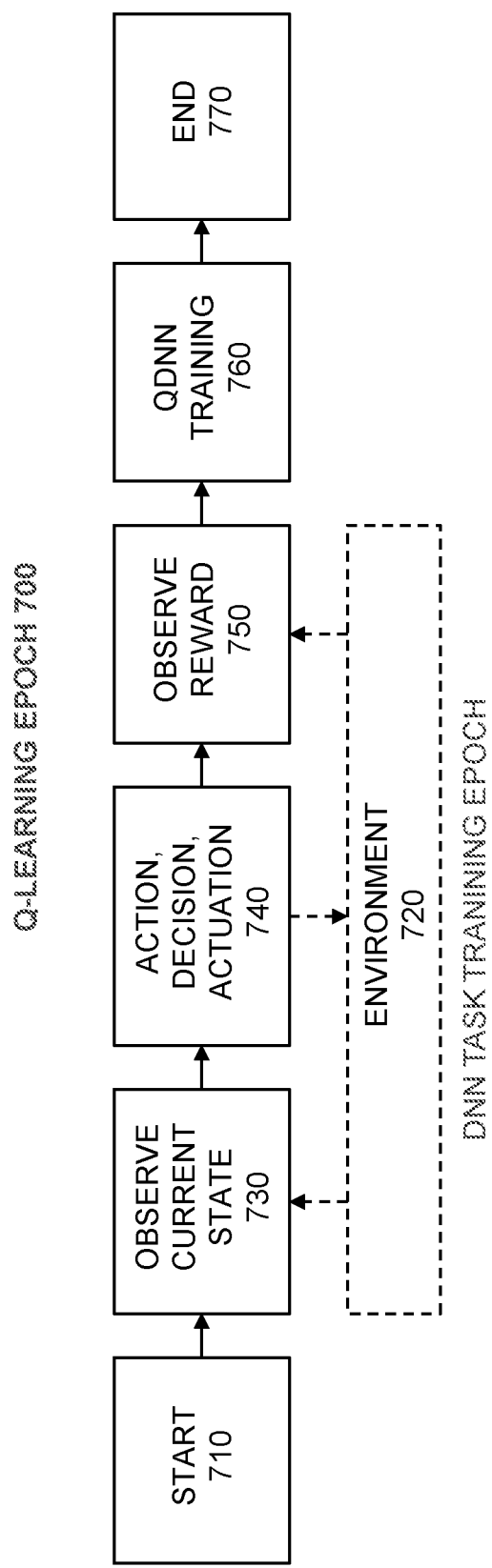
FIG. 7 illustrates the Q-Learning epoch stage of FIG. 6 in further detail, according to at least one embodiment.

FIG. 7 illustrates the Q-Learning epoch stage 700 of FIG. 6 in further detail, according to at least one embodiment. The exemplary Q-Learning epoch stage 700 is started at step 710.

Generally, the first three stages in FIG. 7 (e.g., an "observe current state" stage 730, an "action decision, actuation" stage 740 and an "observe reward" stage 750) are all linked to a definition of the environment task 720. The environment task 720, in the present context, is the DNN task training epoch. Thus, the Q-Learning epoch stage 700 comprises one DNN task training epoch followed by a QDNN training stage 760. The exemplary Q-Learning epoch stage 700 ends at step 770.

As noted above, the DNN task training epoch configures a long-time workload. If a single DNN task training epoch takes several seconds, then the Q-Learning epoch stage 700 takes too long for practical purposes.

Figure 8:
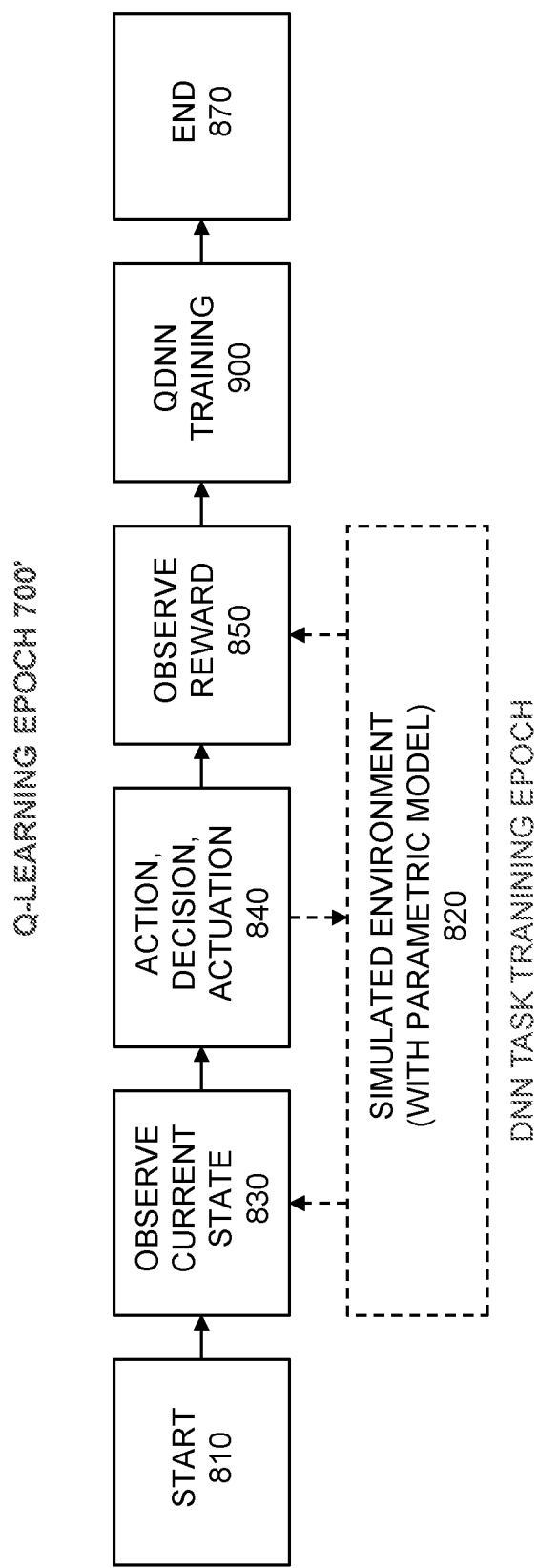
FIG. 8 illustrates an exemplary alternate implementation of the Q-Learning epoch stage of FIG. 6 in further detail, using a simulated environment, according to an embodiment.

FIG. 8 illustrates an exemplary alternate embodiment 700' of the Q-Learning epoch stage 700 of FIG. 6 in further detail, where the actual environment employed in the embodiment of FIG. 7 is replaced by a simulated environment 820 that generates observations from a parametric model. Generally, the embodiment of FIG. 8 substitutes an actual execution of the DNN task training epoch using samples from the domain model discussed above, in conjunction with FIG. 5. The exemplary Q-Learning epoch stage 700' is started at step 810.

In the example of FIG. 8, the first three stages (e.g., an "observe current state" stage 830, an "action decision, actuation" stage 840 and an "observe reward" stage 850) are all linked to a definition of the simulated environment 820. The Q-Learning epoch comprises one DNN task training epoch followed by a QDNN training stage 900, as discussed further below in conjunction with FIG. 9. The exemplary Q-Learning epoch stage 700' ends at step 870.

The action is defined as an increment or decrement of the amount of resources dedicated to the controlled workload. For instance, if the controlled resource is an amount of memory, the action space would be represented by discrete observations as stated in the following set A, which comprises a finite amount of elements:

$$A=\{a_i | a_i \in \mathbb{Q}, |a_i| \leq R_{MAX}, i \in C, C \subset \mathbb{N}\}. \quad (7)$$

Each element $a_i$ corresponds to a variation of the amount of resources dedicated to the controlled task, and $R_{MAX}$ is the allowed limit to this increment and should not be greater than the actual amount of resources in the underlying machine.

The state is defined as follows:

$$s_t=(m_t, m_t-m^*, r_t), \quad (8)$$

where $s_t$ is the state at a time t, $m_t$ is an SLA metric at time t, $m^*$ is an optimal metric (e.g., the one defined in the contract) and $r_t$ is the amount of resources dedicated to the task at time t.

Finally, the reward of an action is defined as the absolute error of the perceived SLA metric and the actual SLA metric, as follows:

$$q_t=|m_t-m^*|. \quad (9)$$

At the beginning of each episode, an initial allocation of resources $r_0$ and the SLA metric set-point $m^*$ are defined. For each epoch, the allocation is changed with an action and a new state and rewards are measured. This pipeline ends in convergence of the episode, which, in the present exemplary context, is a fixed number of epochs. The training of the QDNN is performed at QDNN training stage 900 in a fixed number of episodes, and it trains a neural network that receives the current state $s_t$ and outputs the expected reward q for each of the actions $a_i$, as discussed further below in conjunction with FIG. 9.

Figure 9:
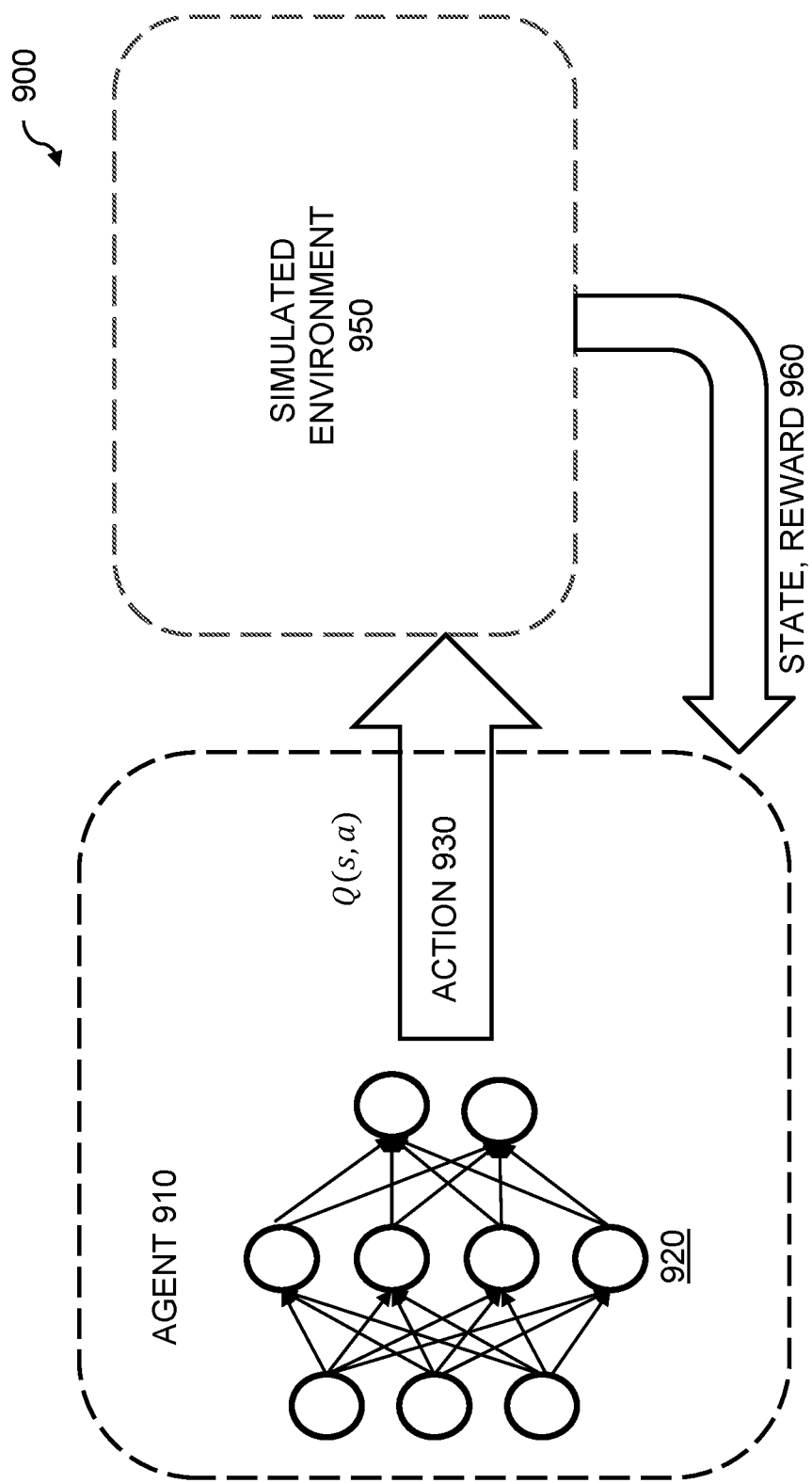
FIG. 9 illustrates the deep Q neural network (QDNN) training stage of FIG. 8 in further detail, according to one exemplary embodiment.

FIG. 9 illustrates the QDNN training stage 900 of FIG. 8 in further detail, according to one exemplary embodiment. Generally, an action (a) 930 is selected by a neural network 920 of a reinforcement learning agent 910 based on the current state s and its expected reward.

In the case of long-time workloads, it would typically be infeasible to train such a network with a large number of episodes because of the amount of time each <action, state-reward> pair takes to be generated. Instead, a simulated environment 950 is employed in the embodiment of FIG. 9 to perform such actions 930 and to obtain the corresponding state-reward values 960. Recalling equation (6), a parametric equation is learned that describes the relation between the inputs, the amount of resources allocated, and the outputs (e.g., the SLA metric derived from that allocation).

In such an environment, it may be artificial to just give the results of the regression right away, since it is a model and, thus, a simplified version of reality. Experiments with this kind of data makes models prone to overfitting and to having poor generalization overall. Instead, in one or more embodiments, the model robustness and generalization capability are enhanced by adding noise to regression results. Instead of just taking the value provided by the regressor, noise is optionally added in the following manner:

$$y=f(\theta,x)+\sigma;$$

$$\sigma \sim \Sigma(0,\eta), \quad (10)$$

where $\sigma \sim \Sigma(0,\eta)$ is random gaussian noise with a mean equal to zero and a standard deviation of $\eta$. To determine the value of $\eta$, two methods might be used, each of them suited for a particular situation:

If there is enough data about the process available, then the value of $\eta$ is the actual standard deviation $\varphi$ from executions;

If there are fewer observations and the observed standard deviation from the data is not statistically significant enough, however, the Root Mean Squared Error (RMSE) observed in the regression is optionally employed as the approximation of $\varphi$.

Empirical evaluations of the disclosed approach suggest that both methods are fitting and contribute towards the generalization of the reinforcement learning agent without any significant additional cost for convergence.

In the Deep Q-Learning approach, the QDNN outputs one result for each possible action in the domain. This implicitly restricts the approach to domains with a finite and discrete number of actions. The set of actions A was previously defined as a finite and discrete set of values, but the resource allocation problem actually configures a continuous action space. With a finite amount of possible actions, one must choose with caution, so as to correctly represent the applicable actions in the domain while not restricting the possibility of convergence of the reinforcement learning agent.

In some embodiments, the actions are selected as follows. Define the minimum possible action $\varepsilon$ and generate further actions as follows:

$$a_i = \varepsilon \cdot 2^{\pm k}; k \in \{0, 1, \ldots, K\}. \tag{11}$$

This procedure ensures that the action set size is 2K+1. As each action is an output of the QDNN, K should be chosen carefully in order to not burden the training phase too much while also giving the network the possibility of reaching faraway configurations in a timely manner. In the following equation, the maximum possible value for K is derived. This is meant to be an upper bound for K and users should not feel obliged to use the particular value in particular implementations, since smaller values of K would also work. The decision is a trade-off between reachability of the set-point (in terms of iterations and QDNN training complexity (longer convergence time for the reinforcement learning agent)):

$$K_{MAX} \leq \frac{\ln(R_{MAX}) - \ln(\varepsilon)}{\ln(2)}. \tag{12}$$

After training in accordance with FIG. 9, the QDNN is ready to perform online adaptation in resource allocation. The training determines the incremental value to be decided by actions, and, naturally, this is the same way the QDNN actuates in the system, as depicted in FIG. 10.

Figure 10:
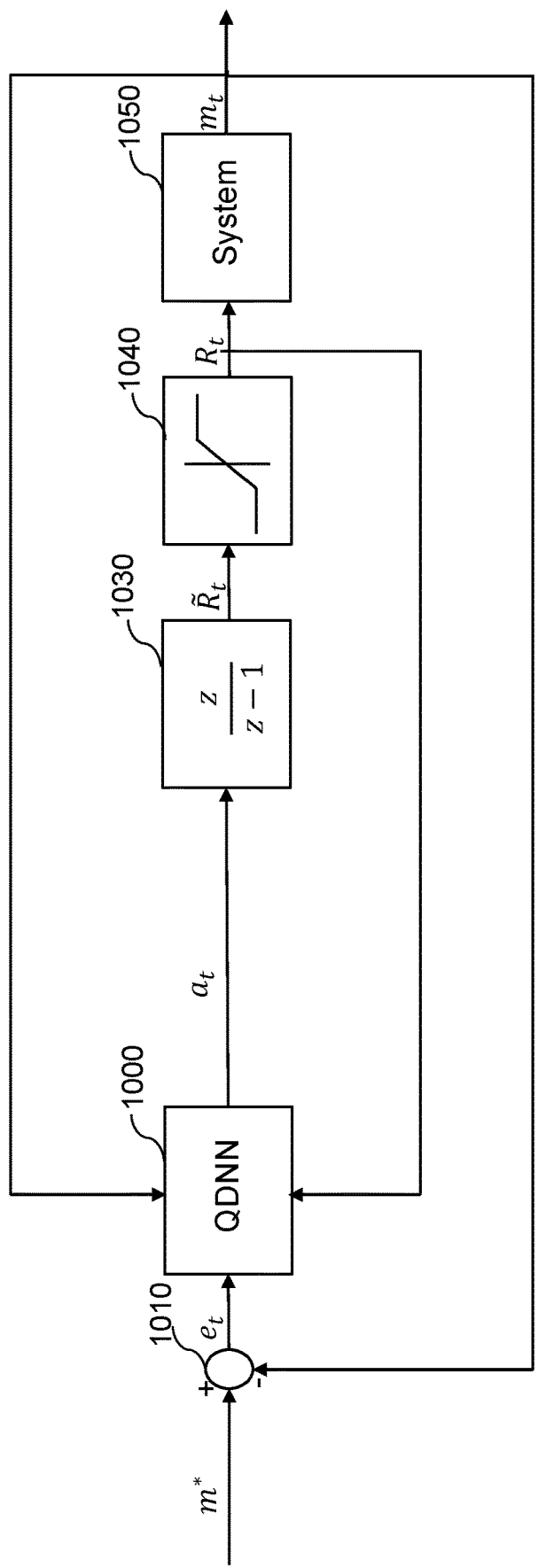
FIG. 10 illustrates a trained QDNN for performing adaptations in resource allocation, according to one or more embodiments of the disclosure.

FIG. 10 illustrates a trained QDNN 1000 performing adaptations in resource allocation, according to one or more embodiments of the disclosure. The input to the trained QDNN 1000 is the SLA, such as the desired time per epoch, m*. The output of the trained QDNN 1000 is the measured SLA metric, $m_t$, which is subtracted from the desired time per epoch, m*, by adder 1010. As shown in FIG. 10, at each milestone, the trained QDNN 1000 receives the state, $R_t$, which is comprised of the SLA metric m*, the error $e_t$ (between the desired time per epoch, m*, and the measured SLA metric, $m_t$) and the current allocation $a_t$ and outputs expected rewards for each possible action. The incremental allocation $a_t$ is added to the previous allocation at stage 1030, and a saturation function is applied at stage 1040, since there are finite resources. Then, the action with the highest expected reward is selected and applied to the system 1050, until the workload terminates.

Example

The training of Deep Learning models is a common task that is resource intensive. The characteristic of the job is to be performed in fixed-size iterations, and each of these iterations are referred to as epochs. The number of training epochs is a parameter, which means the milestones of the job can be defined, and at each iteration, the rate of completion in percentage will be 100*i/n %, where i is the epoch number and n is the number of epochs specified.

Assuming that the SLA metric to be controlled is the execution time (et=1), the amount of time t it took to complete an epoch can be used as a feedback parameter and this time can be compared to the desired time per epoch, which is T/n. If an epoch took longer than T/n to finish, more resources might me be needed. On the other hand, if the time t is significantly smaller than T/n, this indicates that the job does not need the amount of resources allocated to it and reducing the allocation can decrease cost and even make room for other jobs to run.

To build an Artificial Neural Network that suggests corrections to the amount of resources allocated to a task, a model of the relation allocation is needed (e.g., SLA metric and some data from prior executions). Assume that this relation follows the exponential decaying curve detailed in equation (6), which is verified experimentally in the case of a neural network to detect handwritten digits using the famous MNIST (Modified National Institute of Standards and Technology) dataset.

Figure 11:
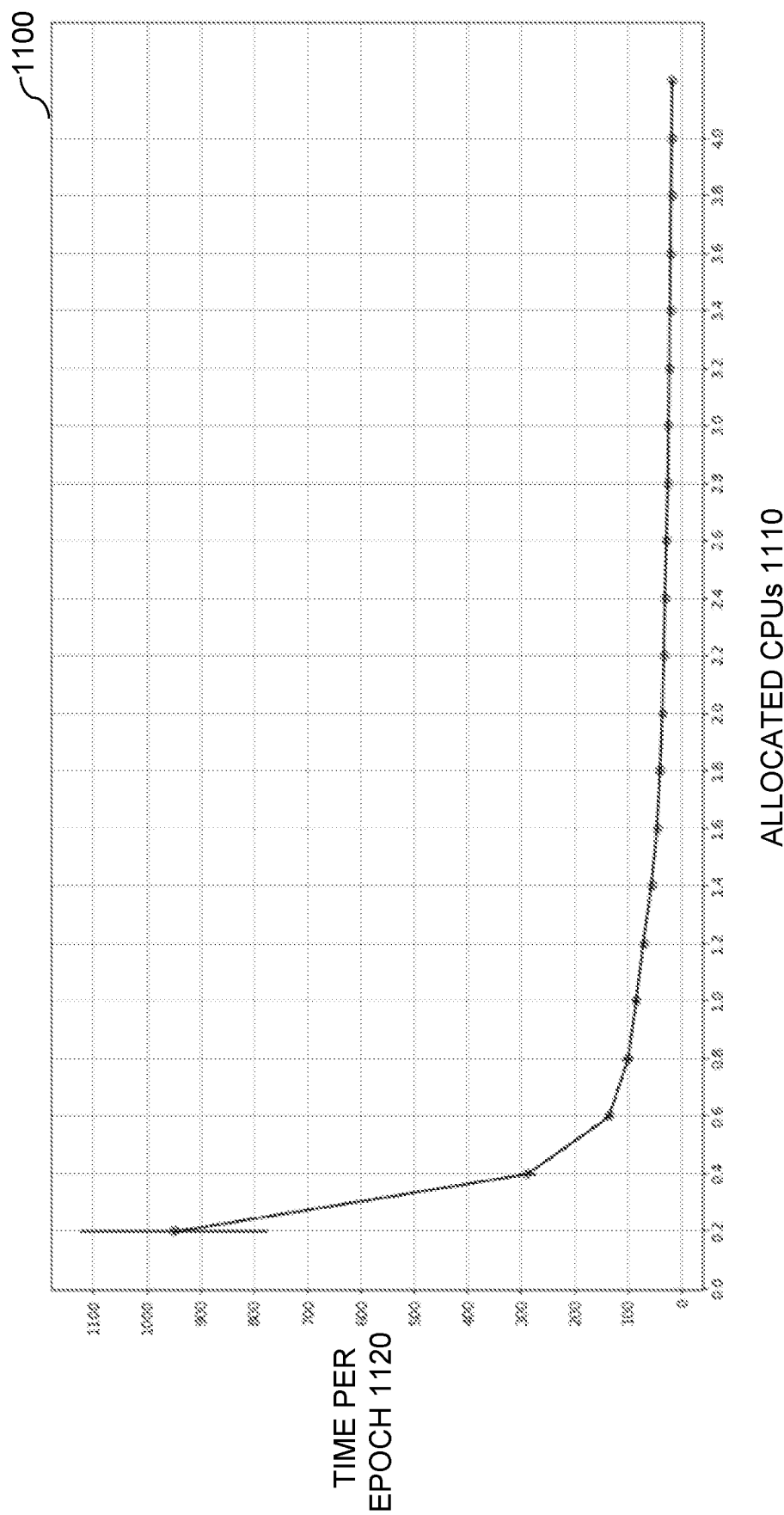
FIG. 11 illustrates a relation between an allocated amount of central processing units and a time per epoch in training a deep neural network (DNN) to detect handwritten digits, according to some embodiments.

FIG. 11 illustrates the relation 1100 between an allocated amount of CPUs (central processing units) 1110 and a time per epoch 1120 in training a DNN to detect handwritten digits, according to some embodiments. To use such a model, the amount of 30 observations, for example, would suffice, but, with a larger dataset, better, more accurate models can be built, as would be apparent to a person of ordinary skill in the art. Using a non-linear regression over a dataset of 2000 points, resulting in a model that got less than 1% mean relative error (MRE) in the test dataset. It is, then, reliable to use this model to simulate executions and to train the QDNN using the Deep-Q Learning framework. The byproduct of this last phase is an Artificial Neural Network that can receive an environment state as input, as detailed above, and discover which of the predefined actions is the best to correct the allocation.

In some embodiments, the disclosed techniques for configuring reinforcement learning agents for resource allocation for iterative workloads reduces an amount of time needed to train such reinforcement learning agents. Among other benefits, the disclosed reinforcement learning agent training techniques use the trained reinforcement learning agents for resource allocation and leverage domain knowledge for generating training samples to thereby reduce the training time.

One or more embodiments of the disclosure provide improved methods, apparatus and computer program products for configuring reinforcement learning agents for resource allocation for iterative workloads. The foregoing applications and associated embodiments should be considered as illustrative only, and numerous other embodiments can be configured using the techniques disclosed herein, in a wide variety of different applications.

It should also be understood that the disclosed resource allocation techniques for iterative workloads, as described herein, can be implemented at least in part in the form of one or more software programs stored in memory and executed by a processor of a processing device such as a computer. As mentioned previously, a memory or other storage device having such program code embodied therein is an example of what is more generally referred to herein as a "computer program product."

The disclosed techniques for configuring reinforcement learning agents for resource allocation for iterative workloads may be implemented using one or more processing platforms. One or more of the processing modules or other components may therefore each run on a computer, storage device or other processing platform element. A given such element may be viewed as an example of what is more generally referred to herein as a "processing device."

As noted above, illustrative embodiments disclosed herein can provide a number of significant advantages relative to conventional arrangements. It is to be appreciated that the particular advantages described above and elsewhere herein are associated with particular illustrative embodiments and need not be present in other embodiments. Also, the particular types of information processing system features and functionality as illustrated and described herein are exemplary only, and numerous other arrangements may be used in other embodiments.

In these and other embodiments, compute services can be offered to cloud infrastructure tenants or other system users as a Platform-as-a-Service (PaaS) offering, although numerous alternative arrangements are possible.

Some illustrative embodiments of a processing platform that may be used to implement at least a portion of an information processing system comprise cloud infrastructure including virtual machines implemented using a hypervisor that runs on physical infrastructure. The cloud infrastructure further comprises sets of applications running on respective ones of the virtual machines under the control of the hypervisor. It is also possible to use multiple hypervisors each providing a set of virtual machines using at least one underlying physical machine. Different sets of virtual machines provided by one or more hypervisors may be utilized in configuring multiple instances of various components of the system.

These and other types of cloud infrastructure can be used to provide what is also referred to herein as a multi-tenant environment. One or more system components such as a cloud-based reinforcement learning agent configuration engine, or portions thereof, are illustratively implemented for use by tenants of such a multi-tenant environment.

Cloud infrastructure as disclosed herein can include cloud-based systems such as Amazon Web Services (AWS), Google Cloud Platform (GCP) and Microsoft Azure. Virtual machines provided in such systems can be used to implement at least portions of a cloud-based reinforcement learning agent configuration platform in illustrative embodiments. The cloud-based systems can include object stores such as Amazon S3, GCP Cloud Storage, and Microsoft Azure Blob Storage.

In some embodiments, the cloud infrastructure additionally or alternatively comprises a plurality of containers implemented using container host devices. For example, a given container of cloud infrastructure illustratively comprises a Docker container or other type of Linux Container (LXC). The containers may run on virtual machines in a multi-tenant environment, although other arrangements are possible. The containers may be utilized to implement a variety of different types of functionality within the storage devices. For example, containers can be used to implement respective processing devices providing compute services of a cloud-based system. Again, containers may be used in combination with other virtualization infrastructure such as virtual machines implemented using a hypervisor.

Illustrative embodiments of processing platforms will now be described in greater detail with reference to FIGS. 12 and 13. These platforms may also be used to implement at least portions of other information processing systems in other embodiments.

Figure 12:
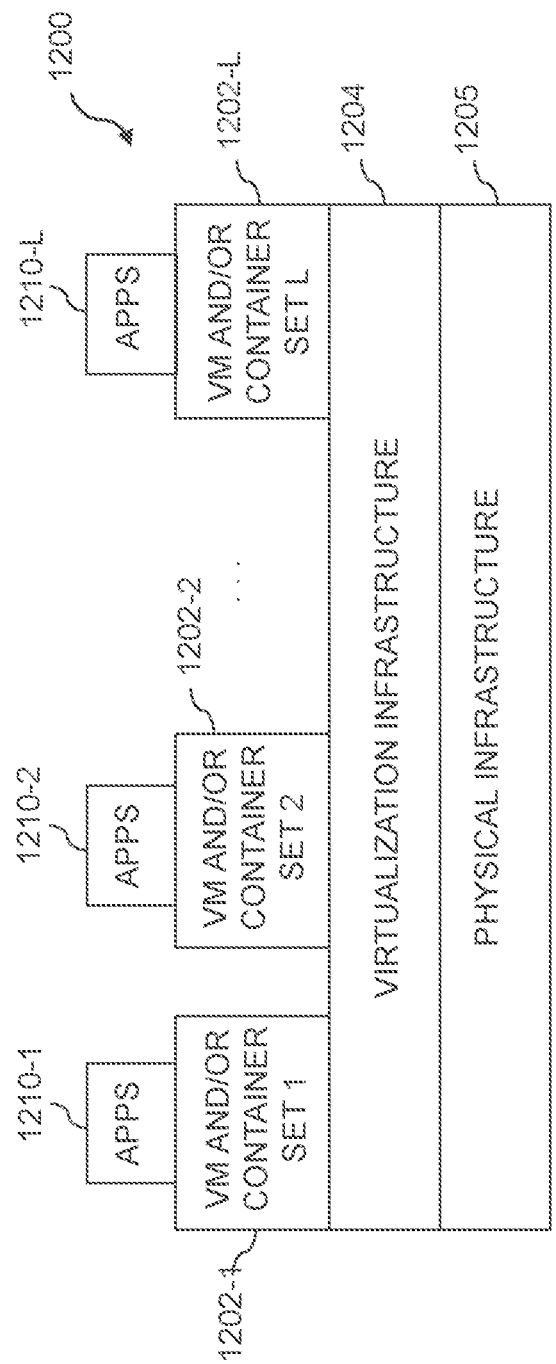
FIG. 12 illustrates an exemplary processing platform that may be used to implement at least a portion of one or more embodiments of the disclosure comprising a cloud infrastructure.

FIG. 12 shows an example processing platform comprising cloud infrastructure 1200. The cloud infrastructure 1200 comprises a combination of physical and virtual processing resources that may be utilized to implement at least a portion of the reinforcement learning module 100. The cloud infrastructure 1200 comprises multiple virtual machines (VMs) and/or container sets 1202-1, 1202-2, . . . 1202-L implemented using virtualization infrastructure 1204. The virtualization infrastructure 1204 runs on physical infrastructure 1205, and illustratively comprises one or more hypervisors and/or operating system level virtualization infrastructure. The operating system level virtualization infrastructure illustratively comprises kernel control groups of a Linux operating system or other type of operating system.

The cloud infrastructure 1200 further comprises sets of applications 1210-1, 1210-2, . . . 1210-L running on respective ones of the VMs/container sets 1202-1, 1202-2, . . . 1202-L under the control of the virtualization infrastructure 1204. The VMs/container sets 1202 may comprise respective VMs, respective sets of one or more containers, or respective sets of one or more containers running in VMs.

In some implementations of the FIG. 12 embodiment, the VMs/container sets 1202 comprise respective VMs implemented using virtualization infrastructure 1204 that comprises at least one hypervisor. Such implementations can provide reinforcement learning agent configuration functionality for resource allocation for iterative workloads of the type described above for one or more processes running on a given one of the VMs. For example, each of the VMs can implement reinforcement learning agents for providing resource allocation functionality for one or more processes running on that particular VM.

An example of a hypervisor platform that may be used to implement a hypervisor within the virtualization infrastructure 1204 is the VMware® vSphere® which may have an associated virtual infrastructure management system such as the VMware® vCenter™. The underlying physical machines may comprise one or more distributed processing platforms that include one or more storage systems.

In other implementations of the FIG. 12 embodiment, the VMs/container sets 1202 comprise respective containers implemented using virtualization infrastructure 1204 that provides operating system level virtualization functionality, such as support for Docker containers running on bare metal hosts, or Docker containers running on VMs. The containers are illustratively implemented using respective kernel control groups of the operating system. Such implementations can provide reinforcement learning agent configuration functionality for resource allocation for iterative workloads of the type described above for one or more processes running on different ones of the containers. For example, a container host device supporting multiple containers of one or more container sets can implement one or more instances of reinforcement learning agent configuration control logic and associated trained reinforcement learning agents for use in resource allocation for iterative workloads.

As is apparent from the above, one or more of the processing modules or other components of reinforcement learning module 100 may each run on a computer, server, storage device or other processing platform element. A given such element may be viewed as an example of what is more generally referred to herein as a "processing device." The cloud infrastructure 800 shown in FIG. 8 may represent at least a portion of one processing platform. Another example of such a processing platform is processing platform 1300 shown in FIG. 13.

The processing platform 1300 in this embodiment comprises at least a portion of the given system and includes a plurality of processing devices, denoted 1302-1, 1302-2, 1302-3, . . . 1302-K, which communicate with one another over a network 1304. The network 1304 may comprise any type of network, such as a wireless area network (WAN), a local area network (LAN), a satellite network, a telephone or cable network, a cellular network, a wireless network such as WiFi or WiMAX, or various portions or combinations of these and other types of networks.

The processing device 1302-1 in the processing platform 1300 comprises a processor 1310 coupled to a memory 1312. The processor 1310 may comprise a microprocessor, a microcontroller, an application specific integrated circuit (ASIC), a field programmable gate array (FPGA) or other type of processing circuitry, as well as portions or combinations of such circuitry elements, and the memory 1312, which may be viewed as an example of a "processor-readable storage media" storing executable program code of one or more software programs.

Articles of manufacture comprising such processor-readable storage media are considered illustrative embodiments. A given such article of manufacture may comprise, for example, a storage array, a storage disk or an integrated circuit containing RAM, ROM or other electronic memory, or any of a wide variety of other types of computer program products. The term "article of manufacture" as used herein should be understood to exclude transitory, propagating signals. Numerous other types of computer program products comprising processor-readable storage media can be used.

Also included in the processing device 1302-1 is network interface circuitry 1314, which is used to interface the processing device with the network 1304 and other system components, and may comprise conventional transceivers.

The other processing devices 1302 of the processing platform 1300 are assumed to be configured in a manner similar to that shown for processing device 1302-1 in the figure.

Again, the particular processing platform 1300 shown in the figure is presented by way of example only, and the given system may include additional or alternative processing platforms, as well as numerous distinct processing platforms in any combination, with each such platform comprising one or more computers, storage devices or other processing devices.

Figure 13:
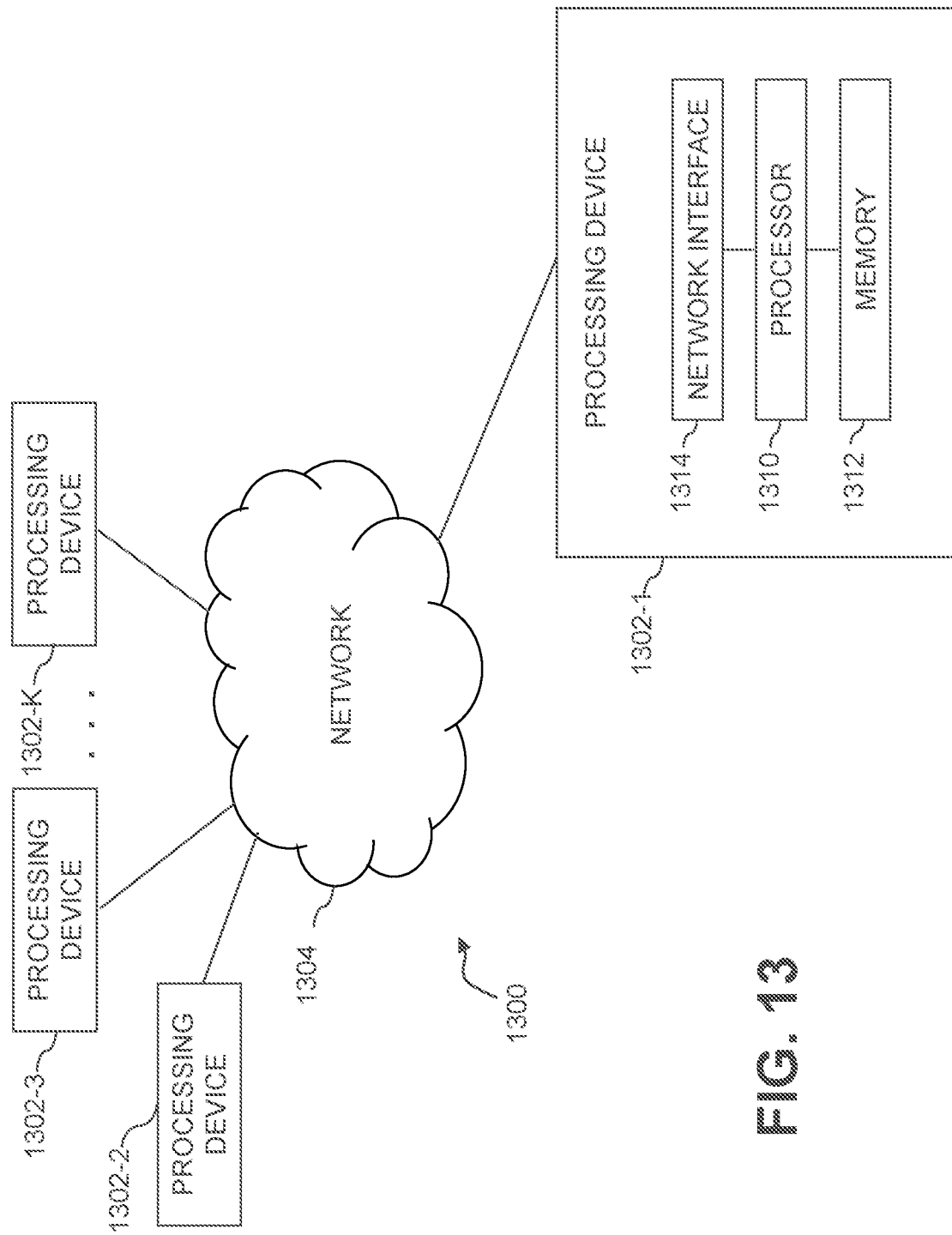
FIG. 13 illustrates another exemplary processing platform that may be used to implement at least a portion of one or more embodiments of the disclosure.

Multiple elements of an information processing system may be collectively implemented on a common processing platform of the type shown in FIG. 12 or 13, or each such element may be implemented on a separate processing platform.

For example, other processing platforms used to implement illustrative embodiments can comprise different types of virtualization infrastructure, in place of or in addition to virtualization infrastructure comprising virtual machines. Such virtualization infrastructure illustratively includes container-based virtualization infrastructure configured to provide Docker containers or other types of LXCs.

As another example, portions of a given processing platform in some embodiments can comprise converged infrastructure such as VxRail™, VxRack™, VxBlock™, or Vblock® converged infrastructure commercially available from VCE, the Virtual Computing Environment Company, now the Converged Platform and Solutions Division of Dell EMC.

It should therefore be understood that in other embodiments different arrangements of additional or alternative elements may be used. At least a subset of these elements may be collectively implemented on a common processing platform, or each such element may be implemented on a separate processing platform.

Also, numerous other arrangements of computers, servers, storage devices or other components are possible in the information processing system. Such components can communicate with other elements of the information processing system over any type of network or other communication media.

As indicated previously, components of an information processing system as disclosed herein can be implemented at least in part in the form of one or more software programs stored in memory and executed by a processor of a processing device. For example, at least portions of the functionality shown in one or more of the figures are illustratively implemented in the form of software running on one or more processing devices.

It should again be emphasized that the above-described embodiments are presented for purposes of illustration only. Many variations and other alternative embodiments may be used. For example, the disclosed techniques are applicable to a wide variety of other types of information processing systems. Also, the particular configurations of system and device elements and associated processing operations illustratively shown in the drawings can be varied in other embodiments. Moreover, the various assumptions made above in the course of describing the illustrative embodiments should also be viewed as exemplary rather than as requirements or limitations of the disclosure. Numerous other alternative embodiments within the scope of the appended claims will be readily apparent to those skilled in the art.

What is claimed is:

1. A method, comprising:

obtaining (i) a specification of an iterative workload comprising a plurality of states of the iterative workload and a set of available actions for one or more of the plurality of states, and (ii) a domain model of the iterative workload that relates an amount of resources allocated in training data with one or more service metrics, wherein a duration of one simulated iteration of a plurality of simulated iterations of the iterative workload using said domain model of the iterative workload satisfies one or more predefined duration criteria;

adjusting weights of at least one reinforcement learning agent by performing iteration steps for each simulated iteration of the iterative workload and then using variables observed during a given simulated iteration of the iterative workload to refine the at least one reinforcement learning agent; and determining, by the at least one reinforcement learning agent, a dynamic resource allocation policy for the iterative workload, wherein the iteration steps for each simulated iteration of the iterative workload comprise:

(a) employing the at least one reinforcement learning agent to select an action from the set of available actions for a current state, obtain a reward for the selected action and select a next state based on one or more of the current state and the selected action for the current state;

(b) updating, by the at least one reinforcement learning agent, a value of a quality function that evaluates a quality of a plurality of state-action combinations using a weighted average of: (i) the value of the quality function for the current state and the selected action for the current state and (ii) the reward for the selected action and the value of the quality function for the next state and at least one of the set of available actions for the next state, wherein the set of available actions for the next state comprises one or more of an increment and a decrement of the amount of resources allocated to the iterative workload, wherein the current state is associated with a first time and comprises at least a first service metric associated with the first time and an amount of resources allocated to the iterative workload at the first time, and wherein the next state is associated with a second time and comprises at least a second service metric associated with the second time and an amount of resources allocated to the iterative workload at the second time; and (c) repeating the employing and updating steps with a new allocation of resources for a respective simulated iteration of the iterative workload.

2. The method of claim 1, wherein the domain model is obtained from sample training executions used to learn the relationship between the amount of resources allocated and the one or more service metrics.

3. The method of claim 1, wherein the step of adjusting weights of the at least one reinforcement learning agent employs a reward metric based on a difference between a desired service metric and a measured service metric.

4. The method of claim 1, wherein the step of adjusting weights of the at least one reinforcement learning agent comprises a neural network selecting an action from the set of available actions based on a current state and an expected reward of the selected action and comparing the expected reward of the selected action to the actual obtained reward.

5. The method of claim 1, wherein the iterative workload comprises a training of a Deep Neural Network.

6. The method of claim 1, wherein possible actions for resource allocation are discretized using a control action parameter.

7. The method of claim 1, wherein the simulated iteration executes in a simulated environment that generates observations from the domain model.

8. The method of claim 1, wherein the quality function is approximated using a deep Q neural network (QDNN).

9. A computer program product, comprising a non-transitory machine-readable storage medium having encoded therein executable code of one or more software programs, wherein the one or more software programs when executed by at least one processing device perform the following steps:

obtaining (i) a specification of an iterative workload comprising a plurality of states of the iterative workload and a set of available actions for one or more of the plurality of states, and (ii) a domain model of the iterative workload that relates an amount of resources allocated in training data with one or more service metrics, wherein a duration of one simulated iteration of a plurality of simulated iterations of the iterative workload using said domain model of the iterative workload satisfies one or more predefined duration criteria;

adjusting weights of at least one reinforcement learning agent by performing iteration steps for each simulated iteration of the iterative workload and then using variables observed during a given simulated iteration of the iterative workload to refine the at least one reinforcement learning agent; and determining, by the at least one reinforcement learning agent, a dynamic resource allocation policy for the iterative workload, wherein the iteration steps for each simulated iteration of the iterative workload comprise:

(a) employing the at least one reinforcement learning agent to select an action from the set of available actions for a current state, obtain a reward for the selected action and select a next state based on one or more of the current state and the selected action for the current state;

(b) updating, by the at least one reinforcement learning agent, a value of a quality function that evaluates a quality of a plurality of state-action combinations using a weighted average of: (i) the value of the quality function for the current state and the selected action for the current state and (ii) the reward for the selected action and the value of the quality function for the next state and at least one of the set of available actions for the next state, wherein the set of available actions for the next state comprises one or more of an increment and a decrement of the amount of resources allocated to the iterative workload, wherein the current state is associated with a first time and comprises at least a first service metric associated with the first time and an amount of resources allocated to the iterative workload at the first time, and wherein the next state is associated with a second time and comprises at least a second service metric associated with the second time and an amount of resources allocated to the iterative workload at the second time; and (c) repeating the employing and updating steps with a new allocation of resources for a respective simulated iteration of the iterative workload.

10. The computer program product of claim 9, wherein the domain model is obtained from sample training executions used to learn the relationship between the amount of resources allocated and the one or more service metrics.

11. The computer program product of claim 9, wherein the step of adjusting weights of the at least one reinforcement learning agent employs a reward metric based on a difference between a desired service metric and a measured service metric.

12. The computer program product of claim 9, wherein the step of adjusting weights of the at least one reinforcement learning agent comprises a neural network selecting an action from the set of available actions based on a current state and an expected reward of the selected action and comparing the expected reward of the selected action to the actual obtained reward.

13. The computer program product of claim 9, wherein the iterative workload comprises a training of a Deep Neural Network.

14. The computer program product of claim 9, wherein possible actions for resource allocation are discretized using a control action parameter.

15. An apparatus, comprising:

a memory; and at least one processing device, coupled to the memory, operative to implement the following steps:

obtaining (i) a specification of an iterative workload comprising a plurality of states of the iterative workload and a set of available actions for one or more of the plurality of states, and (ii) a domain model of the iterative workload that relates an amount of resources allocated in training data with one or more service metrics, wherein a duration of one simulated iteration of a plurality of simulated iterations of the iterative workload using said domain model of the iterative workload satisfies one or more predefined duration criteria;

adjusting weights of at least one reinforcement learning agent by performing iteration steps for each simulated iteration of the iterative workload and then using variables observed during a given simulated iteration of the iterative workload to refine the at least one reinforcement learning agent; and determining, by the at least one reinforcement learning agent, a dynamic resource allocation policy for the iterative workload, wherein the iteration steps for each simulated iteration of the iterative workload comprise:

(a) employing the at least one reinforcement learning agent to select an action from the set of available actions for a current state, obtain a reward for the selected action and select a next state based on one or more of the current state and the selected action for the current state;

(b) updating, by the at least one reinforcement learning agent, a value of a quality function that evaluates a quality of a plurality of state-action combinations using a weighted average of: (i) the value of the quality function for the current state and the selected action for the current state and (ii) the reward for the selected action and the value of the quality function for the next state and at least one of the set of available actions for the next state, wherein the set of available actions for the next state comprises one or more of an increment and a decrement of the amount of resources allocated to the iterative workload, wherein the current state is associated with a first time and comprises at least a first service metric associated with the first time and an amount of resources allocated to the iterative workload at the first time, and wherein the next state is associated with a second time and comprises at least a second service metric associated with the second time and an amount of resources allocated to the iterative workload at the second time; and (c) repeating the employing and updating steps with a new allocation of resources for a respective simulated iteration of the iterative workload.

16. The apparatus of claim 15, wherein the domain model is obtained from sample training executions used to learn the relationship between the amount of resources allocated and the one or more service metrics.

17. The apparatus of claim 15, wherein the step of adjusting weights of the at least one reinforcement learning agent employs a reward metric based on a difference between a desired service metric and a measured service metric.

18. The apparatus of claim 15, wherein the step of adjusting weights of the at least one reinforcement learning agent comprises a neural network selecting an action from the set of available actions based on a current state and an expected reward of the selected action and comparing the expected reward of the selected action to the actual obtained reward.

19. The apparatus of claim 15, wherein possible actions for resource allocation are discretized using a control action parameter.

20. The apparatus of claim 15, wherein the simulated iteration executes in a simulated environment that generates observations from the domain model.

* * * * *